(12) United States Patent
Gill et al.

(10) Patent No.: US 11,029,459 B2
(45) Date of Patent: *Jun. 8, 2021

(54) PHASE GRATINGS WITH ODD SYMMETRY FOR HIGH-RESOLUTION LENSLESS OPTICAL SENSING

(71) Applicant: Rambus Inc., Sunnvyvale, CA (US)

(72) Inventors: Patrick R. Gill, Sunnyvale, CA (US); David G. Stork, Portola Valley, CA (US)

(73) Assignee: Rambus Inc., San Jose, CA (US)

( * ) Notice: Subject to any disclaimer, the term of this patent is extended or adjusted under 35 U.S.C. 154(b) by 96 days.

This patent is subject to a terminal disclaimer.

(21) Appl. No.: 15/953,597

(22) Filed: Apr. 16, 2018

(65) Prior Publication Data
US 2018/0299604 A1    Oct. 18, 2018

Related U.S. Application Data

(63) Continuation of application No. 14/770,080, filed as application No. PCT/US2014/019976 on Mar. 3, 2014, now Pat. No. 9,971,078.
(Continued)

(51) Int. Cl.
*G02B 5/30*    (2006.01)
*G02B 5/18*    (2006.01)
(Continued)

(52) U.S. Cl.
CPC ......... *G02B 5/3083* (2013.01); *G02B 5/1842* (2013.01); *G02B 5/1871* (2013.01);
(Continued)

(58) Field of Classification Search
CPC .. H04N 5/23232; H04N 5/335; G02B 5/3083; G02B 5/1842; G02B 5/1871;
(Continued)

(56) References Cited

U.S. PATENT DOCUMENTS 3,891,321 A * 6/1975 Hock ..................... G01D 5/38
                                                       250/237 G
5,113,286 A    5/1992 Morrison
(Continued)

FOREIGN PATENT DOCUMENTS

CN        101004532 A     7/2007
CN        101055882 A    10/2007
(Continued)

OTHER PUBLICATIONS

Article 19 Amendment dated Sep. 3, 2014 in International Application No. PCT/US2014/019976. 9 pages.
(Continued)

*Primary Examiner* — Antoinette T Spinks
(74) *Attorney, Agent, or Firm* — Silicon Edge Law Group LLP; Arthur J. Behiel

(57) ABSTRACT

Image-sensing devices include odd-symmetry gratings that cast interference patterns over a photodetector array. Grating features offer considerable insensitivity to the wavelength of incident light, and also to the manufactured distance between the grating and the photodetector array. Photographs and other image information can be extracted from interference patterns captured by the photodetector array. Images can be captured without a lens, and cameras can be made smaller than those that are reliant on lenses and ray-optical focusing.

19 Claims, 13 Drawing Sheets

Related U.S. Application Data

(60) Provisional application No. 61/773,128, filed on Mar. 5, 2013.

(51) Int. Cl.
| | |
|---|---|
| *G02B 27/46* | (2006.01) |
| *H04N 5/335* | (2011.01) |
| *H01L 27/146* | (2006.01) |
| *G02B 27/42* | (2006.01) |
| *H04N 5/232* | (2006.01) |

(52) U.S. Cl.
CPC ......... *G02B 27/4205* (2013.01); *G02B 27/46* (2013.01); *H01L 27/14625* (2013.01); *H01L 27/14685* (2013.01); *H04N 5/23232* (2013.01); *H04N 5/335* (2013.01)

(58) Field of Classification Search
CPC ............... G02B 27/4205; G02B 27/46; G01L 27/14625; G01L 27/14685
See application file for complete search history.

(56) References Cited

U.S. PATENT DOCUMENTS

| | | | |
|---|---|---|---|
| 6,137,535 | A | 10/2000 | Meyers |
| 7,202,896 | B2 | 4/2007 | Wako et al. |
| 7,923,677 | B2 | 4/2011 | Slinger |
| 9,515,113 | B2 | 12/2016 | Gill et al. |
| 2007/0121210 | A1* | 5/2007 | Sato ............... G02B 5/1866 359/569 |
| 2009/0020714 | A1 | 1/2009 | Slinger |
| 2010/0118172 | A1 | 5/2010 | McCarten et al. |
| 2011/0058075 | A1* | 3/2011 | Yanagita ........... H01L 27/14621 348/273 |
| 2011/0085051 | A1 | 4/2011 | Chi et al. |
| 2011/0248151 | A1 | 10/2011 | Holcombe et al. |
| 2013/0120763 | A1 | 5/2013 | Grenet et al. |
| 2013/0229486 | A1 | 9/2013 | Molnar et al. |
| 2014/0253781 | A1 | 9/2014 | Gill et al. |
| 2015/0340396 | A1 | 11/2015 | Blayvas |

FOREIGN PATENT DOCUMENTS

| | | |
|---|---|---|
| CN | 101435890 A | 5/2009 |
| CN | 101526464 A | 9/2009 |
| CN | 101571423 A | 11/2009 |
| CN | 201707463 U | 1/2011 |
| EP | 1950752 A1 | 7/2008 |
| JP | 2005-84485 A | 3/2005 |
| JP | 2009-529160 A | 8/2009 |
| WO | WO-1992-007281 A1 | 4/1992 |
| WO | WO-2001-065305 A1 | 9/2001 |
| WO | WO-2011-072408 A1 | 6/2011 |
| WO | WO-2012-007561 A2 | 1/2012 |
| WO | WO-2012-058360 A2 | 5/2012 |

OTHER PUBLICATIONS

CN Office Action dated Nov. 16, 2017 re: CN Appln. No. 201480010625.4. 8 Pages. (With Translation).
CN Office Action dated Mar. 7, 2017 re: CN Appln. No. 201480010625.4. 8 pages. (With Translation).
EP Response with EP Appln. No. 14714454.7 filed on Feb. 24, 2016 in Response to EP Official Communication Pursuant to Rules 161(1) and 162 EPC dated Oct. 15, 2015. 21 Pages.
Garcia-Martinez et al., "Generation of Bessel Beam Arrays Through Dammann Gratings", Mar. 20, 2012, vol. 51, No. 9, Applied Optics. pp. 1375-1381. 7 Pages.
Gill et al., "Robustness of Planar Fourier Capture Arrays to Colour Changes and Lost Pixels," Sep. 12-16, 2011, 9th International Conference on Position Sensitive Detectors, Aberystwyth, United Kingdom. 15 pages.
Gill et al., "Scaling Properties of Well-Tiled PFCAs," 2012 Optical Society of America. 3 pages.
Guerineau et al., "Generation of Achromatic and Propagation-Invariant Spot Arrays by Use of Continuously Self-Imaging Gratings," vol. 26, No. 7, Apr. 1, 2001. 3 pages.
Horisaki et al., "Regularized Image Reconstruction for Continuously Self-Imaging Gratings," vol. 52, No. 16, Jun. 1, 2013. 10 pages.
JP Office Action dated May 24, 2018 re: JP Appln. No. 2015-561506. 3 Pages. (W/Translation).
JP Office Action dated Jan. 31, 2018 re: JP Appln. No. 2015-561506. 5 Pages. (W/Translation).
JP Office Action dated Oct. 13, 2017 re: JP Appln. No. 2015-561506. 13 Pages. (With Translation).
Morrison, Rick L., "Symmetries that Simplify the Design of Spot Array Phase Gratings," Journal of the Optical Society of America A, vol. 9, Issue 3, pp. 464-471, 1992. 8 pages.
PCT International Preliminary Report on Patentability (Chapter I) in International Application No. PCT/US14/019976. 9 pages.
PCT International Search Report dated Jul. 4, 2014 in International Application No. PCT/US2014/019976. 13 pages.
Piponnier et al., "Relevance of Continuously Self-Imaging Gratings for Noise Robust Imagery," vol. 37, No. 17, Sep. 1, 2012. 3 pages.
Wang et al., "A Light-Field Image Sensor in 180nm CMOS," IEEE Journal of Solid-State Circuits, vol. 47, No. 1, Jan. 2012, pp. 257-271. 15 pages.
CN Office Action dated May 25, 2018 re CN Appln. No. 201480010625.4. 8 Pages. (W/Translation).
Communication Pursuant to Article 94(3) EPC dated Nov. 21, 2018 re: EP Appln. No. 14714454.7. 5 Pages.
EP Communication Pursuant to Article 94(3) EPC dated Apr. 9, 2020 re: EP Appln. No. 14714454.7. 8 Pages.

* cited by examiner

PHASE GRATINGS WITH ODD SYMMETRY FOR HIGH-RESOLUTION LENSLESS OPTICAL SENSING

BACKGROUND

A planar Fourier capture array (PFCA) is an image-sensing device that employs an array of angle-sensitive pixels to obviate the needs for a mirror, lens, focal length, or moving parts. The pixel array can be made using standard integrated-circuit fabrication processes. As a consequence of these advantages, PFCAs can be made much smaller and less expensive than the smallest focusing camera.

Some PFCAs use a near-filed diffraction effect known as the "Talbot effect" to create the angle-sensitive pixels. Such image sensors include two diffraction gratings patterned over and in parallel with an array of photosensors. The spacing between the gratings is important, and can be difficult to obtain reliably using inexpensive and readily available fabrication processes. Moreover, the gratings are sensitive to the wavelength of incident light in a wavelength band of interest, making it difficult to accurately reproduce color images.

BRIEF DESCRIPTION OF THE DRAWINGS

The figures are illustrations by way of example, and not by way of limitation. Like reference numerals in the figures refer to similar elements.

DETAILED DESCRIPTION

Figure 1A:
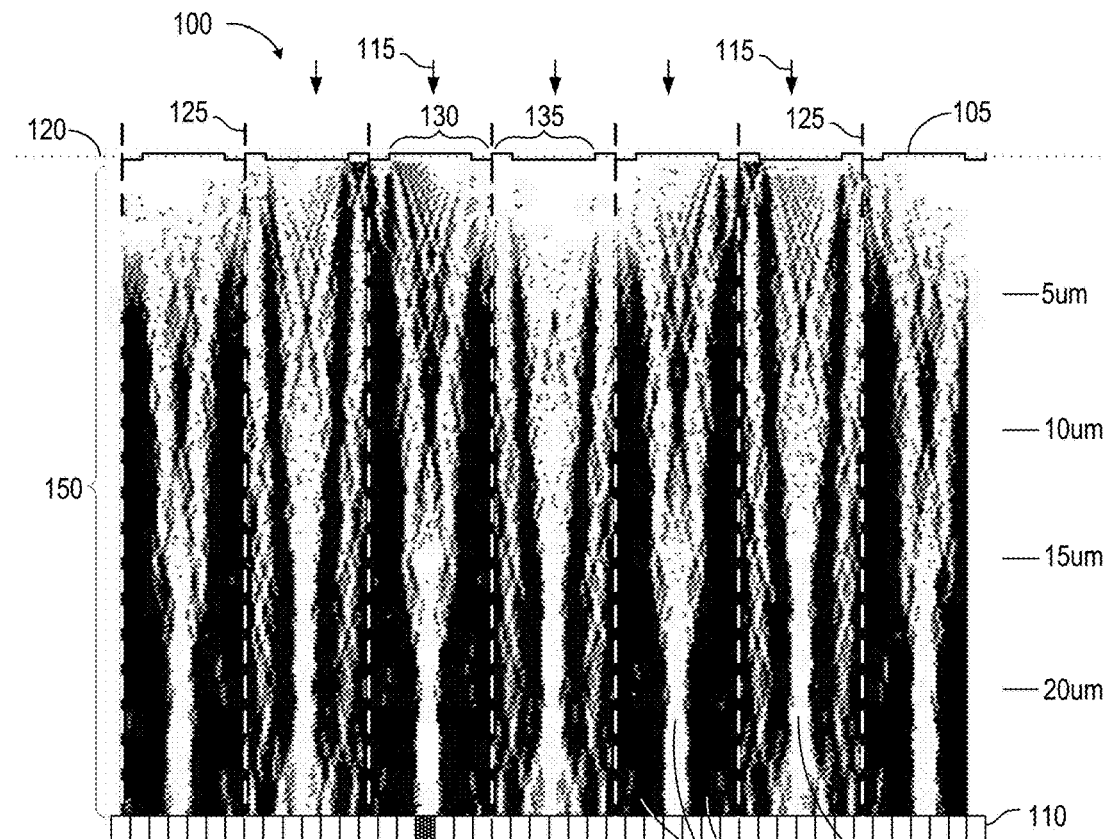
FIGS. 1A and 1B are cut-away views of a sensing device 100 with an odd-symmetry grating 105 overlying a photo-detector array 110 and simulating light of respective incident planes 115 and 160.

FIG. 1A is a cut-away view of a sensing device 100 with an odd-symmetry grating 105 overlying a photodetector array 110. The features of grating 105 offer considerable insensitivity to the wavelength of incident light in a wavelength band of interest, and also to the manufactured distance between grating 105 and photodetector array 110. Grating 105 produces an interference pattern for capture by array 110. Photographs and other image information can then be extracted from the pattern. Images can thus be captured without a lens, and cameras can be made smaller than those that are reliant on lenses and ray-optical focusing.

Light in a wavelength band of interest—such as the visible spectrum—is incident grating 105 from a direction 115 that is normal to a transverse plane 120 of the grating 105. Dashed lines 125 highlight periodic boundaries of substantially odd symmetry. Each of these boundaries is a result of features 130 and 135 of odd symmetry, and produces a normally arranged curtain 140 of minimum intensity created by destructive phase interference between adjacent features 130 and 135. Curtains 140 are separated by foci 145, and the collection of curtains 140 and foci 145 (curtains of maximum light intensity) extend from grating 105 through the body 150 of device 100 to produce an interference pattern on photodetector array 110. One photosensitive element 155 within array 110 is shaded beneath a focus 145 to serve as a reference for a subsequent discussion of the sensitivity of device 100 to the angle of incident light.

The image of FIG. 1A resulted from a simulation of a sensing device with the following parameters and assuming specific parameters. Body 150 is of fused silica, and is in contact with a conventional photodetector array 110 with photosensitive elements spaced by 2.2 um. The top of grating 105 is an air interface in this example. The relatively small segments of features 130 and 135 are about 1 um, and the relatively larger segments are about 4 um. These segments generally form transverse plane 120, which is separate from array 110 by about 25 um. Curtains 140 and foci 145 are the destructive and constructive interference patterns for 532 nm incident light.

The thickness of body 150 was optimized for 400 nm light despite the selection of 532 nm light for the simulation. As a consequence, the tightest focus occurs about 5 um above array 110 (at the 20 um mark). The resultant curtains 140 plainly separate foci 145 well above and below the 20 um mark, however, illustrating a robust insensitivity to wavelength within the band of interest. The relatively deep and continuous penetration of curtains 140 also provides considerable manufacturing tolerance for the thickness of body 150.

Figure 1B:
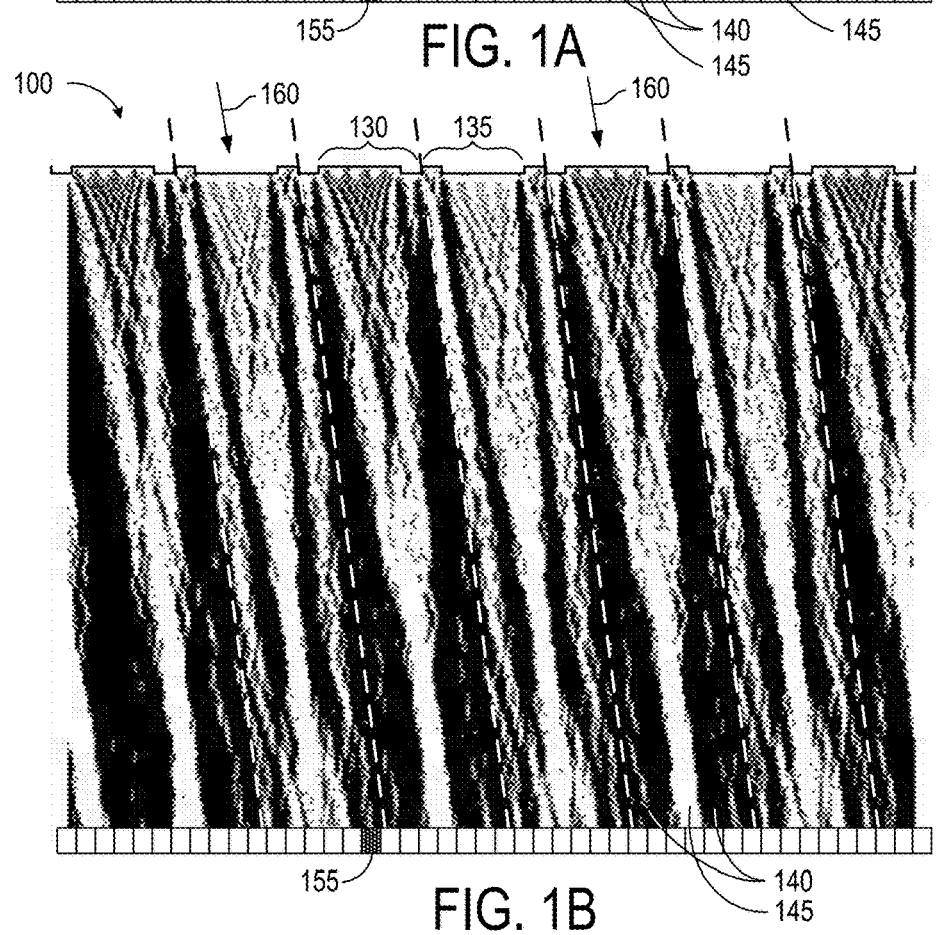

FIG. 1B depicts sensor 100 of FIG. 1A simulating light incident plane 120 at an acute angle 160 to illustrate the sensitivity of curtains 140 and foci 145 to the angle of incidence. Using element 155 as a reference point, we see that that the foci 145 that shined on element 155 in FIG. 1A has considerably moved to the right in FIG. 1B. Curtains 140 and foci 145 extend at an acute angle that relates to angle 160 according to Snell's law. The separation of foci 145 by curtains 140 is maintained. Sensor 100 is thus sensitive to the angle of incidence.

Figure 2:
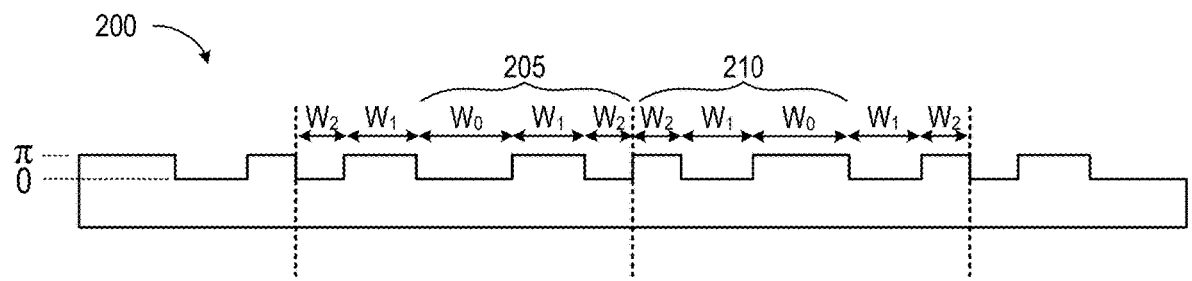
FIG. 2 depicts a binary odd-symmetry grating 200 in accordance with one embodiment.

FIG. 2 depicts a binary odd-symmetry grating 200 in accordance with one embodiment. Each of three boundaries of odd symmetry is indicated using a vertical, dashed line. The upper features of grating 200 are at a height sufficient to induce one half wavelength of retardation in the band of interest relative to lower features, or 1T radians of relative phase delay. Features 205 and 210 on either side of each boundary exhibit odd symmetry with three differently sized segments $W_0$, $W_1$, and $W_2$. With this arrangement, paired segments (e.g., $W_0$ within features 205 and 210) induce respective phase delays that differ by approximately half a wavelength over the wavelength band of interest.

Figure 3:
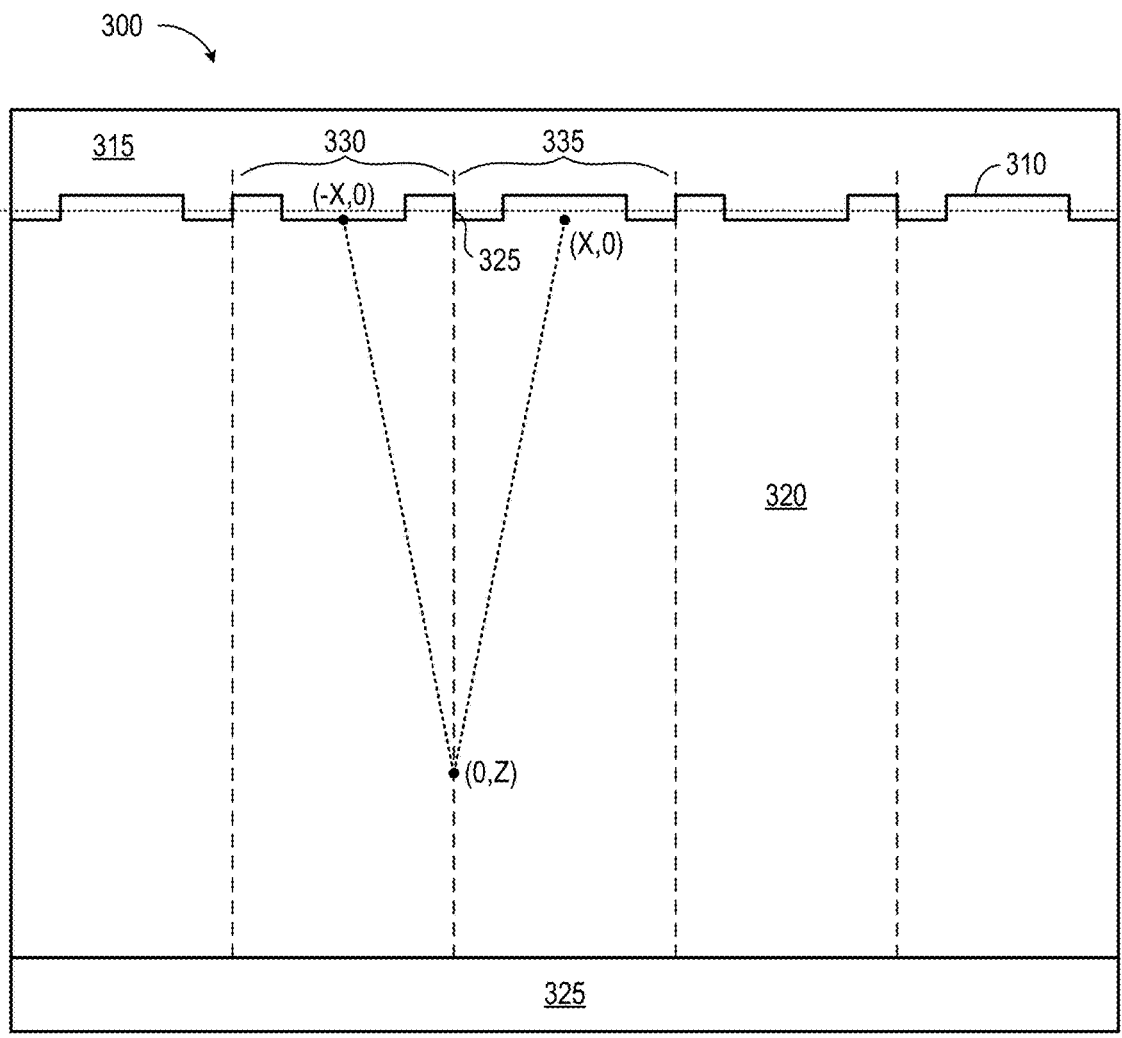
FIG. 3 depicts a sensing device 300 in accordance with an embodiment in which a binary, odd-symmetry phase grating 305 is formed by an interface between materials of two different refractive indices.

FIG. 3 depicts a sensing device 300 in accordance with an embodiment in which a binary, odd-symmetry phase grating 305 is formed by an interface between materials of two different refractive indices, a polycarbonate layer 315 and optical lanthanum dense flint glass 320 in this example. Each of four boundaries of odd symmetry 325 is indicated using a vertical, dashed line. As in the foregoing examples, the upper features of grating 310 induce phase retardations of half of one wavelength ($\pi$ radians) relative to lower features. Features 330 and 335 on either side of each boundary exhibit odd symmetry. With this arrangement, paired features induce respective phase delays that differ by approximately half a wavelength over the wavelength band of interest.

These elements produce an interference pattern on an analyzer layer 325 (e.g., a conventional photodiode array) in the manner detailed in connection with FIGS. 1A and 1B. This example assumes light incident the light interface of grating 300 is normal to the transverse plane of phase grating 310, in which case light beams that enter grating 310 equidistant from a one of the boundaries of odd symmetry 325, such as at locations (−X,0) and (X,0), are out of phase at points beneath array 310 (e.g., point (0,Z)), and thus destructively interfere to produce curtains of minimum intensity (e.g., curtains 140 of FIG. 1). Neither the depth Z nor the wavelength of light substantially influences this destructive interference. Constructive interference similarly produces foci of maximum intensity (e.g., foci 145 of FIG. 1). Both the high and low features admit light, which provides relatively high quantum efficiency relative to gratings that selectively block light.

Figure 4A:
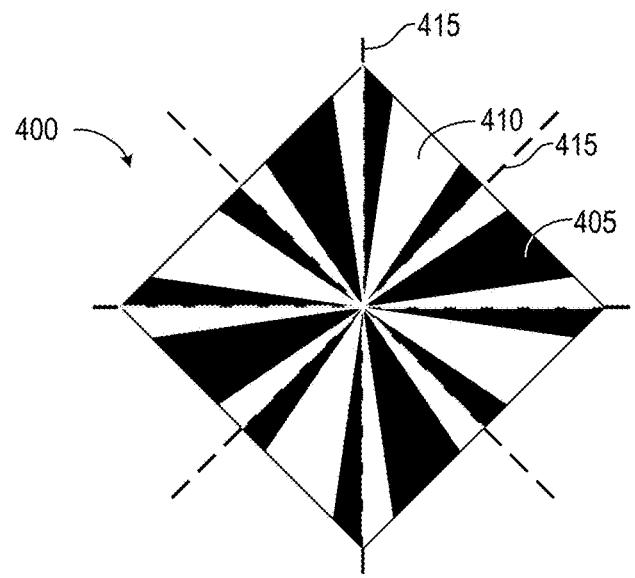
FIG. 4A is a plan view of a sensor 400 in accordance with another embodiment.

FIG. 4A is a plan view of a sensor 400 in accordance with another embodiment. Relatively high segments 405 and low segments 410 on either side of each of eight boundaries of odd symmetry 415 create a grating in which the widths of the segments increase with distance from the center of the sensor. For a given focal depth, light of higher frequencies tends to produce a sharper focus with narrower feature widths. Sensor 400 can therefore be optimized such that the central portion of the grating is optimized for collection of relatively higher frequency light, and the peripheral area for collection of relatively lower frequency light. This topic is detailed below in connection with other Figures.

Figure 4B:
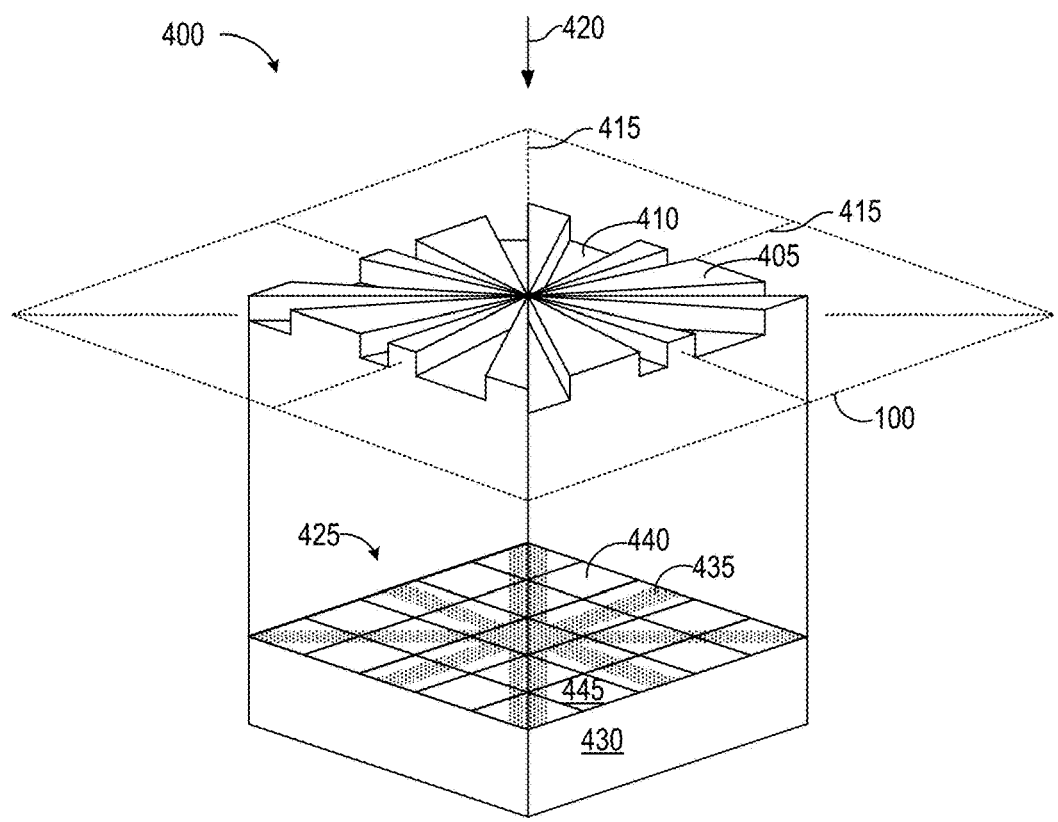
FIG. 4B is a three-dimensional perspective of sensor 400 of FIG. 4A.
Figure 5A:
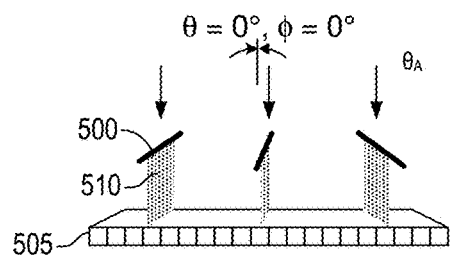
FIGS. 5A, 5B, 5C, and 5D each depict three boundaries of odd symmetry 500 over a two-dimensional photodiode array 505.
Figure 5A:
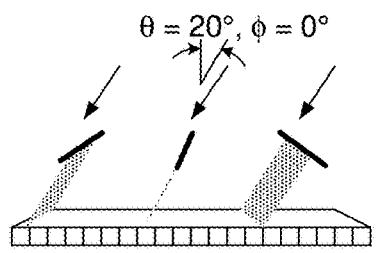
Figure 5A:
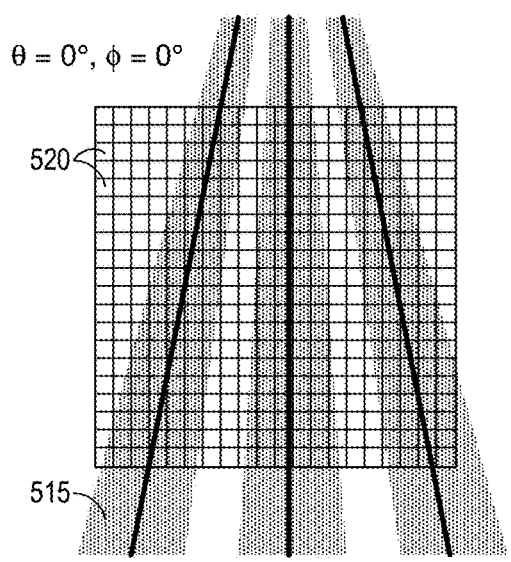
Figure 5B:
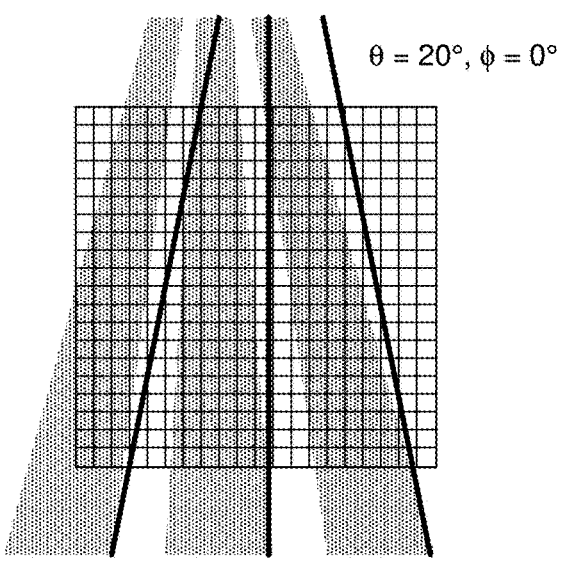
Figure 5C:
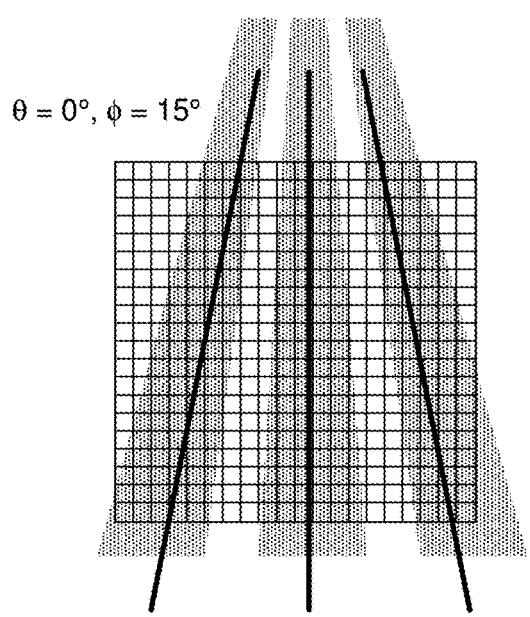
Figure 5D:
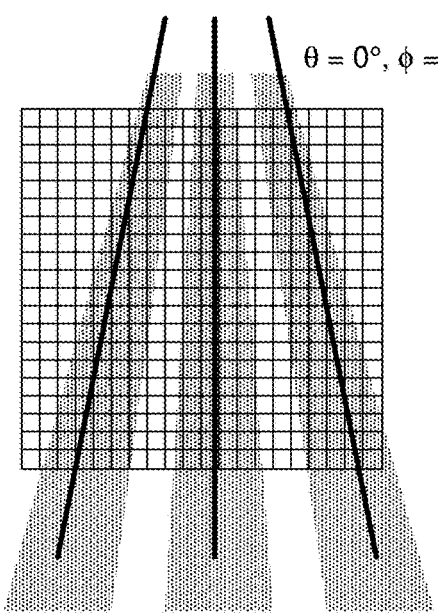

FIG. 4B is a three-dimensional perspective of sensor 400 of FIG. 4A, and shows how light 420 from a direction normal to the grating surface casts an interference pattern 425 on an underlying photodiode array 430. Curtains and foci, as detailed previously, respectively cast shadows 435 and bright shapes 440 to be sensed by individual photosensitive elements 445 of array 430. Array 430 captures a digital representation of pattern 425.

FIGS. 5A, 5B, 5C, and 5D each depict three boundaries of odd symmetry 500 over a two-dimensional photodiode array 505. Curtains 510 cast shadows 515 on the underlying photodetectors 520, and the patterns thus created are different depending upon the angle of incident light. Array 505 can therefore sample the resultant interference pattern to obtain information as to the angle of incidence.

Figure 6:
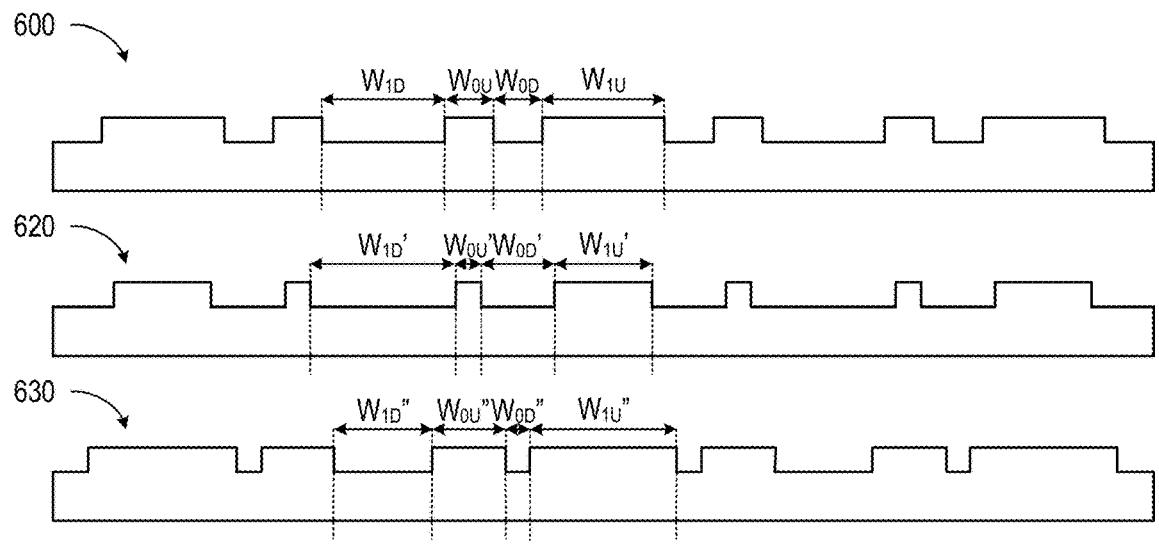
FIG. 6 depicts three odd-symmetry gratings 600, 620, and 630, each with feature segments of different relative widths.

FIG. 6 depicts three odd-symmetry gratings 600, 620, and 630, each with feature segments of different relative widths. It can be useful to create a sensor with multiple width ratios, as shown, to compensate for manufacturing tolerances that impact the relative heights of the grating features. Assuming, for example, that grating 600 is width optimized for a manufacturing process of interest, but that the process produces a relative phase delay of 40% rather than the ideal 50% to form curtains of minimum intensity at the desired positions. To a first order the increased width of the relatively wide segments, as depicted in grating 630, can improve the distortion resulting from the erroneous phase offset. Phase offsets above 50% can be corrected for by narrowing the relatively wide segments, as depicted in grating 620. Some embodiments include a mixture of relative segment widths covering different areas of a photodiode array to accommodate manufacturing tolerances. Images associated with the gratings that provide the sharpest focus, or the sharpest focus for a wavelength of range of wavelengths, can be selected or combined to obtain the desired image data. The different gratings may also perform better for light of different wavelengths or incident angles, so selection of which gratings to use for a given image may be optimized for variables other than manufacturing tolerances.

Figure 7A:
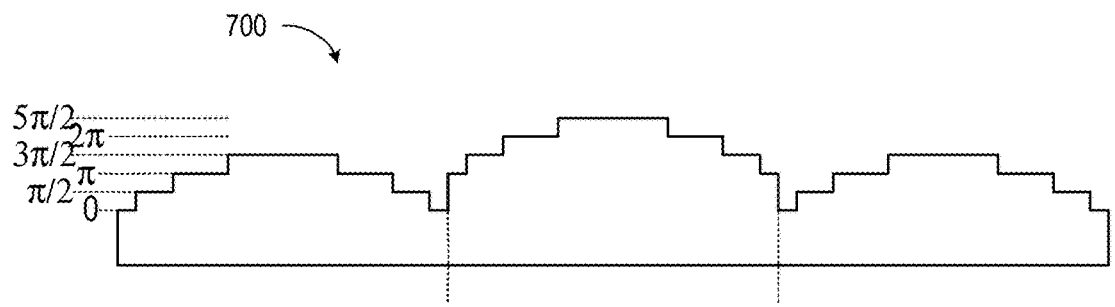
FIG. 7A is a cross-section of a phase grating 700 in accordance with an embodiment that uses more than two levels to produce an odd symmetry.

FIG. 7A is a cross-section of a phase grating 700 in accordance with an embodiment that uses more than two levels to produce an odd symmetry. Additional levels may allow for sharper focus, but may require more complex manufacturing processes. If gratings are to be made using photolithography, for example, additional levels require additional mask steps. Paired surfaces on either side of each boundary of odd symmetry introduce respective paired phase delays that differ by approximately half a wavelength, plus an integer number of wavelengths, over the wavelength band of interest.

Figure 7B:
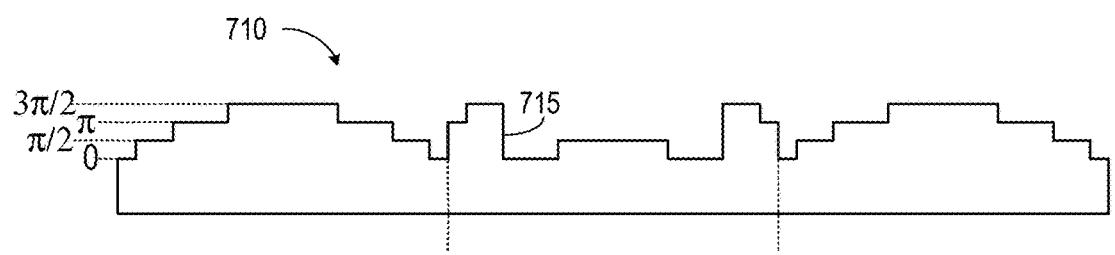
FIG. 7B is a cross-section of a phase grating 710 that is optically similar to phase grating 700 of FIG. 7A but uses fewer layers.

FIG. 7B is a cross-section of a phase grating 710 that is optically similar to phase grating 700 of FIG. 7A, but uses fewer layers. The resultant larger abrupt discontinuities 715 may introduce undesirable image artifacts or may be difficult to manufacture accurately, but the reduced number of levels may reduce manufacturing costs.

Figure 8:
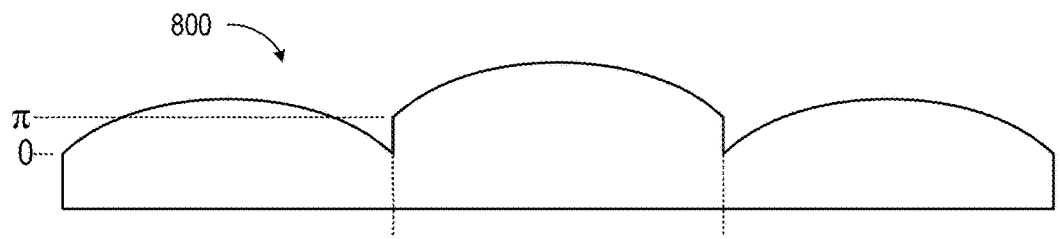
FIG. 8 is a cross-section of a phase grating 800 that illustrates how odd symmetry can be extended to curved functions.

FIG. 8 is a cross-section of a phase grating 800 that illustrates how odd symmetry can be extended to curved functions.

Figure 9:
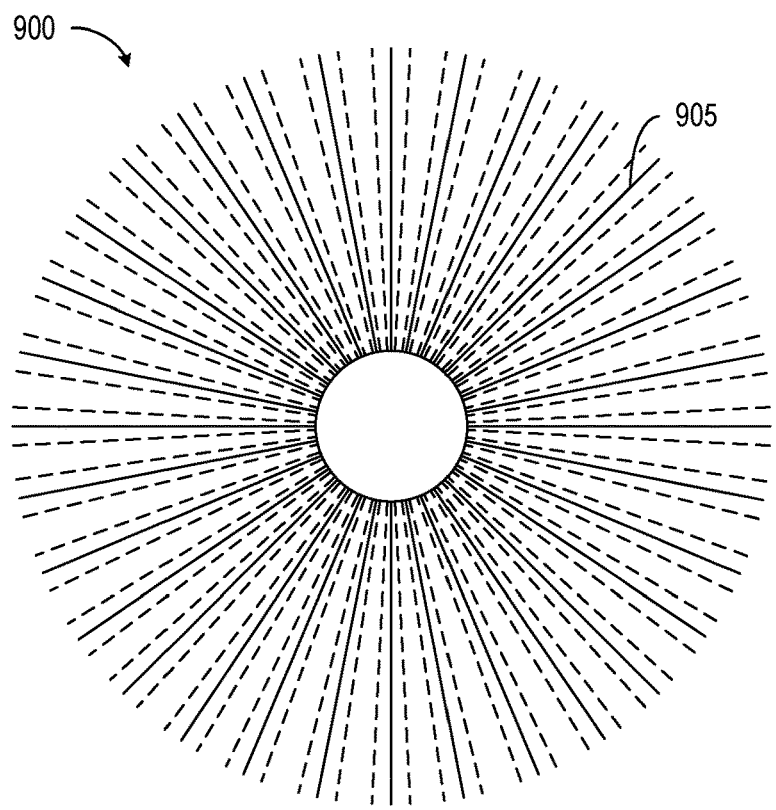
FIG. 9 is a plan view of a grating 900 in accordance with an embodiment in which boundaries of odd symmetry 905 extend radially from the center of the grating, and in which the widths of the feature segments widen gradually away from the center.

FIG. 9 is a plan view of a grating 900 in accordance with an embodiment in which boundaries of odd symmetry 905 extend radially from the center of the grating, and in which the widths of the feature segments widen gradually away from the center. Grating 900 captures image information at sixteen discreet angles with a continuously various set of widths. While convenient to draw grating 900 as a circle, other shapes may be used. In some embodiment, for example, collections of gratings are arrayed over a photodiode array. In such cases grids that share common boundaries (e.g., such as hexagonal, square, or triangular boundaries) make more efficient use of the underlying photodiodes.

Figure 10:
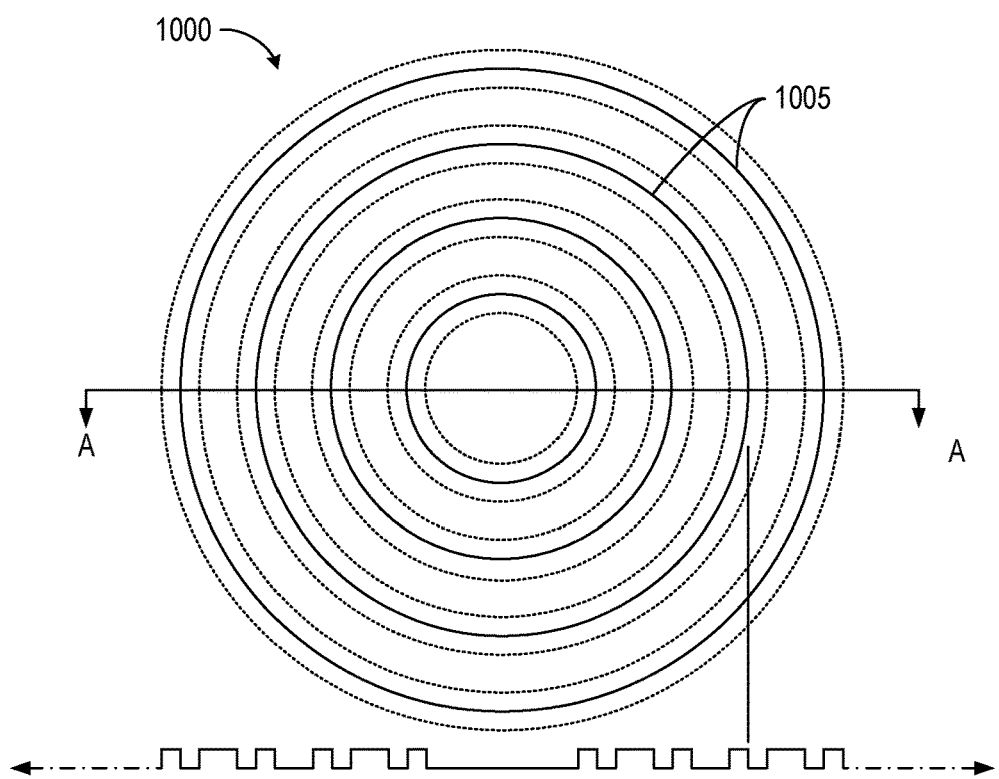
FIG. 10 is a plan view of a grating 1000 in accordance with an embodiment with concentric boundaries of odd symmetry 1005, and includes a cut-away view along line A-A.

FIG. 10 is a plan view of a grating 1000 in accordance with an embodiment with concentric boundaries of odd symmetry 1005, and includes a cut-away view along line A-A. In this example the widths of the feature segments are discrete and the angles are continuous. The spacing of grating 1000 appear consistent, but may be varied to allow for sharp focus for a range of wavelengths, angles of incidence, or manufacturing variations.

Figure 11:
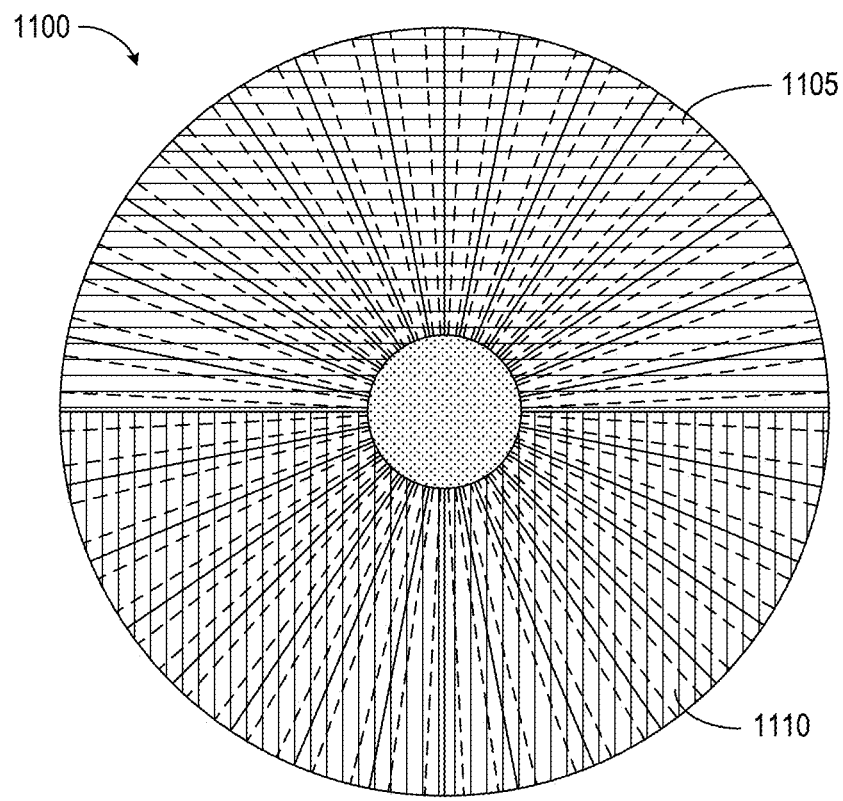
FIG. 11 is a plan view of a grating 1100 in accordance with an embodiment similar to grating 900 of FIG. 9.

FIG. 11 is a plan view of a grating 1100 in accordance with an embodiment similar to grating 900 of FIG. 9. The two halves of grating 900 provide essentially the same information. Grating 1100 adds half-circle polarization filters 1105 and 1110 with perpendicular orientations. Each half of grating 1100 thus produces image data specific to one of two polarizations, and these data can be used separately or together. More or fewer filters, with the same or different orientations, may be used in other embodiments. Different types of filters can also be used to cover all or a portion of gratings of the type described herein.

Figure 12:
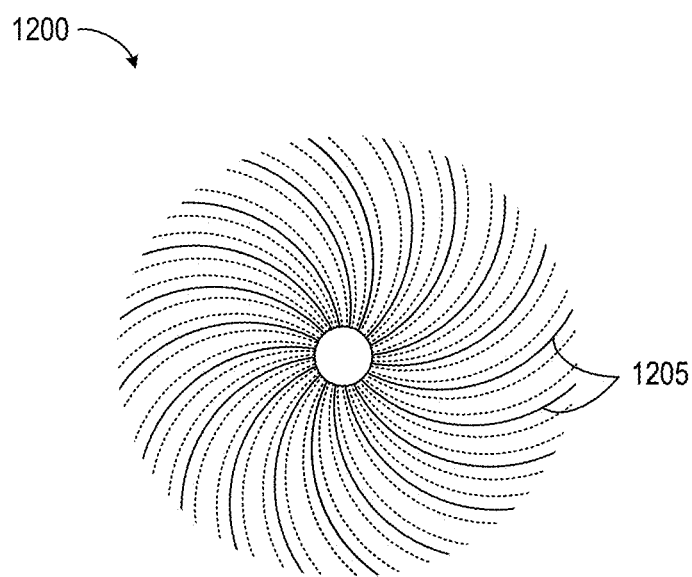
FIG. 12 is a plan view of a grating 1200 in accordance with another embodiment.

FIG. 12 is a plan view of a grating 1200 in accordance with another embodiment. Curved boundaries of odd symmetry 1205 extend radially from the center of the grating, and the widths of the feature segments widen gradually away from the center. The curvature of boundaries 1205 provide continuously varying angular information similar to what is available from grating 1000 of FIG. 10 while retaining the continuously varying spacings of grating 900 of FIG. 9.

Figure 13:
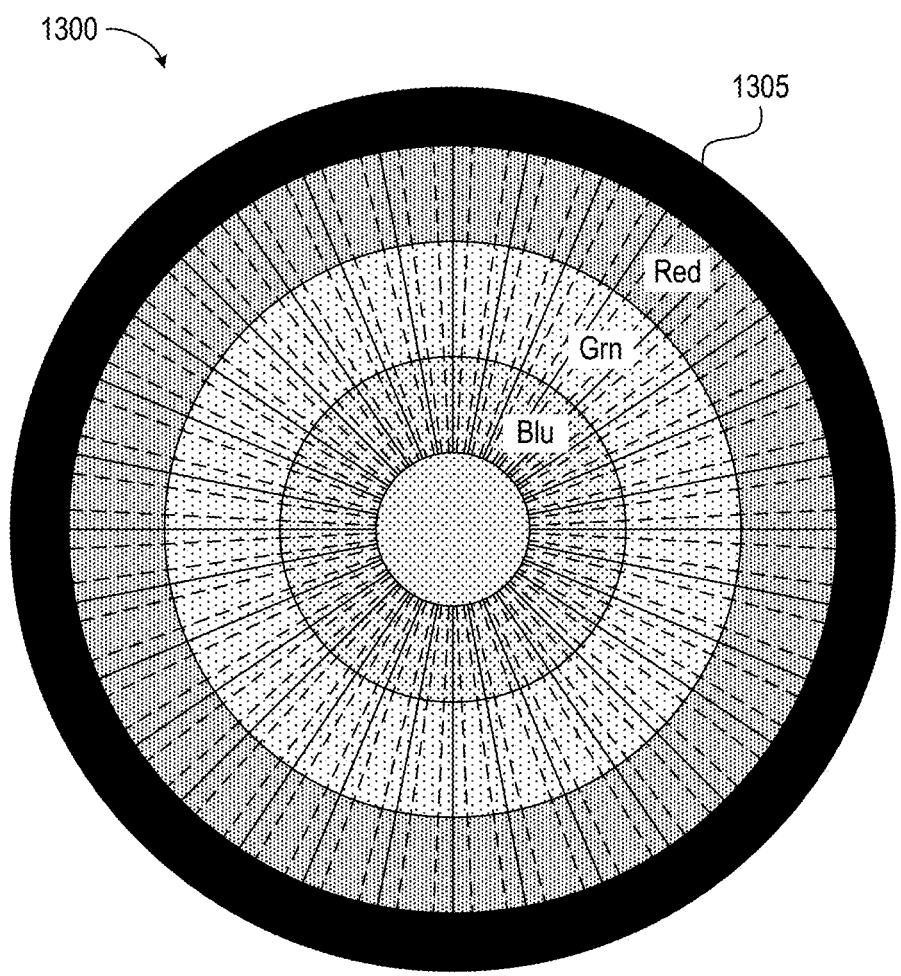
FIG. 13 depicts a grating 1300 in accordance with another embodiment.

FIG. 13 depicts a grating 1300 in accordance with another embodiment. As noted previously, different widths of the grating features provide sharper focus for different colors of light within the wavelength band of interest. Grating 1300 has the same radial symmetry of grating 900 of FIG. 9, but those areas for which the spacing is optimized for blue, green, and red light are provided with filters to admit their respective wavelengths. Omitting wavelengths that provide a blurred interference pattern on the underlying analyzer can improve image sharpness. Grating 1300 is bounded by an opaque mask 1305 that defines the limit of the aperture.

Figure 14:
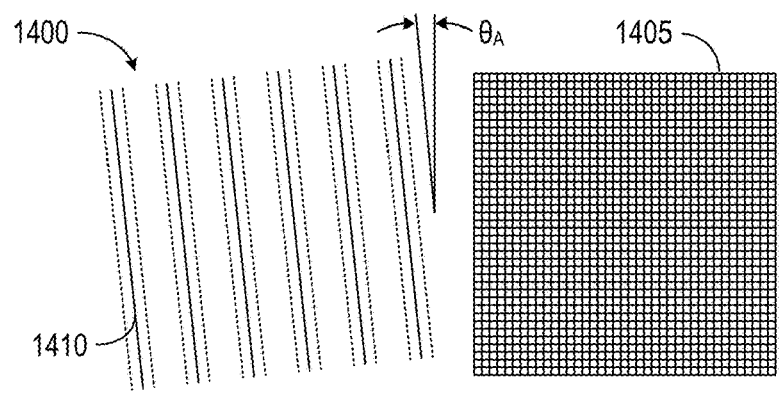
FIG. 14 depicts a grating 1400 and associated photodiode array 1405.

FIG. 14 depicts a grating 1400 and associated photodiode array 1405. Grating 1400 has parallel odd-symmetry boundaries 1410, which may have features of the same or different widths, or of varying widths along one or more boundaries. Parallel boundaries with the requisite diversity of widths and spacings to sample a sufficient number of spatial frequencies can image e.g. barcodes. Array 1405 is shown alongside, rather than below, grating 1400 to highlight the angle $\theta_A$ between the direction of boundaries 1410 and the columns of photosensitive elements in array 1405. Angle $\theta_A$ creates more diversity of measurements because the linear shadow covers different percentages of pixels in different rows. In one embodiment angle $\theta_A$ is selected so that the top of each boundary is offset from the bottom by about one pixel of array 1405.

Figure 15:
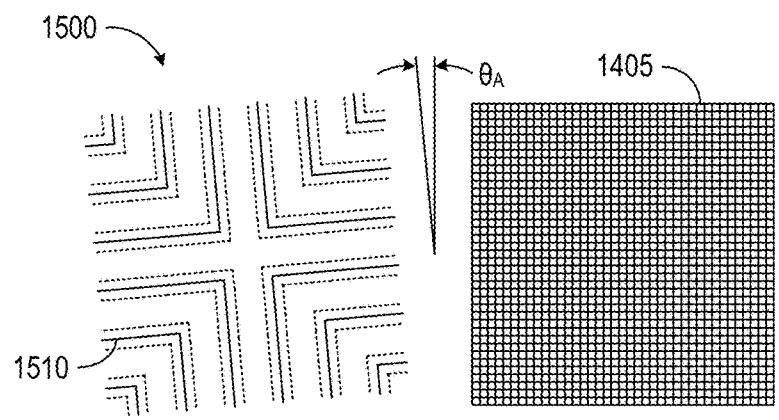
FIG. 15 depicts a grating 1500 and associated photodiode array 1505.

FIG. 15 depicts a grating 1500 and associated photodiode array 1505. Grating 1500 has parallel, right-angled boundaries 1510, which may have features of the same or different widths, or of varying widths along one or more boundaries. Parallel boundaries with the requisite diversity of widths and spacings along two dimensions to sample a sufficient number of spatial frequencies can image e.g. point sources, such as to identify the position of the sun. Angle $\theta_A$ can be introduced for the reasons presented above in connection with FIG. 14.

Figure 16:
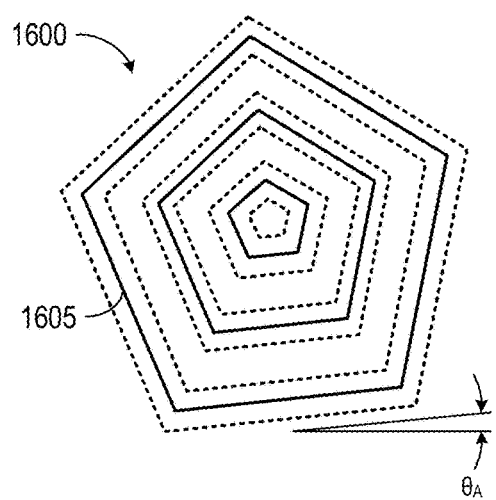
FIG. 16 is a plan view of a grating 1600 in accordance with an embodiment with pentagonal boundaries of odd symmetry 1605.

FIG. 16 is a plan view of a grating 1600 in accordance with an embodiment with pentagonal boundaries of odd symmetry 1605. In this example the widths of the feature segments are discrete, but they can vary along one or more boundaries in other embodiments. Straight boundaries may be advantageous over curved ones because line segments can more easily provide precise odd symmetry.

Grating 1600 provides information at five different orientations. Other boundary shapes, such as other polygons, are used in other embodiments. In general, polygons with odd numbers of sides provide greater orientation diversity than polygons with a similar but even number of sides (e.g., a pentagon provides more orientation diversity than a square or a hexagon).

Figure 17A:
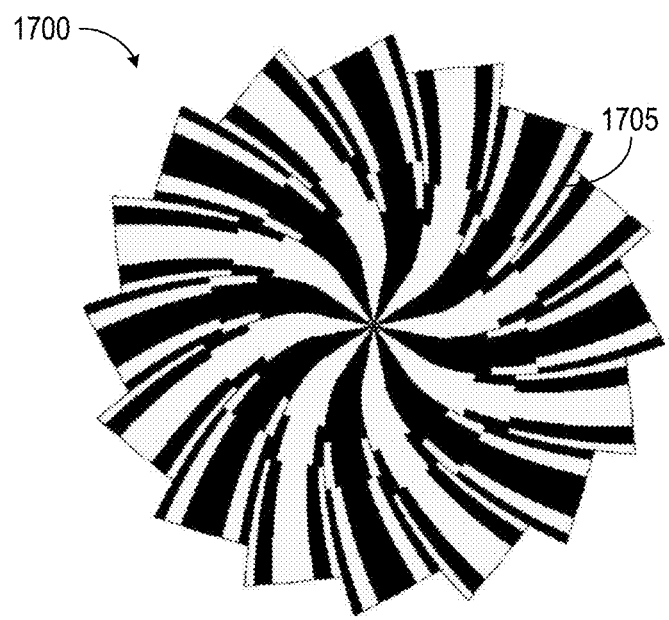
FIG. 17A is a plan view of a grating 1700 in accordance with another embodiment.
Figure 17B:
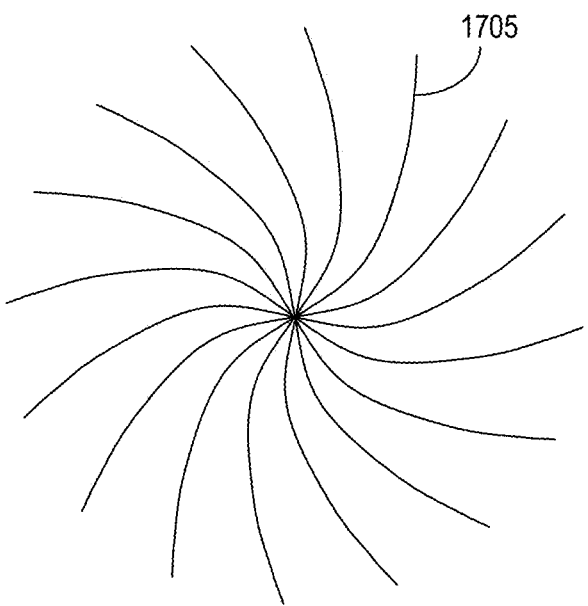

FIG. 17A is a plan view of a grating 1700 in accordance with another embodiment. Recalling that relatively narrow (wide) segment spacing works better for relatively high (low) frequencies, feature spacing increases along odd-symmetry boundaries (between dark and light regions) with distance from the center. Curved boundaries of odd symmetry 1705 extend radially from the center of the grating to the periphery, radiating out between the dark (elevated) and light (recessed) arms near the center. The curved boundaries are obscured by grating features in FIG. 17A, so the shapes of boundaries 1705 are depicted in FIG. 17B for ease of review.

The segment widths do not continue to increase with radius, as there is a maximum desired width for a given wavelength band of interest (e.g., the widest may correspond to the lowest frequency of visible red light). The features that define boundaries 1705 therefore exhibit discontinuities as they extend toward the periphery of grating 1700. In this example, grating 1700 has three discrete areas each tuned to a subset or all of the wavelengths in the band of interest.

Figure 18:
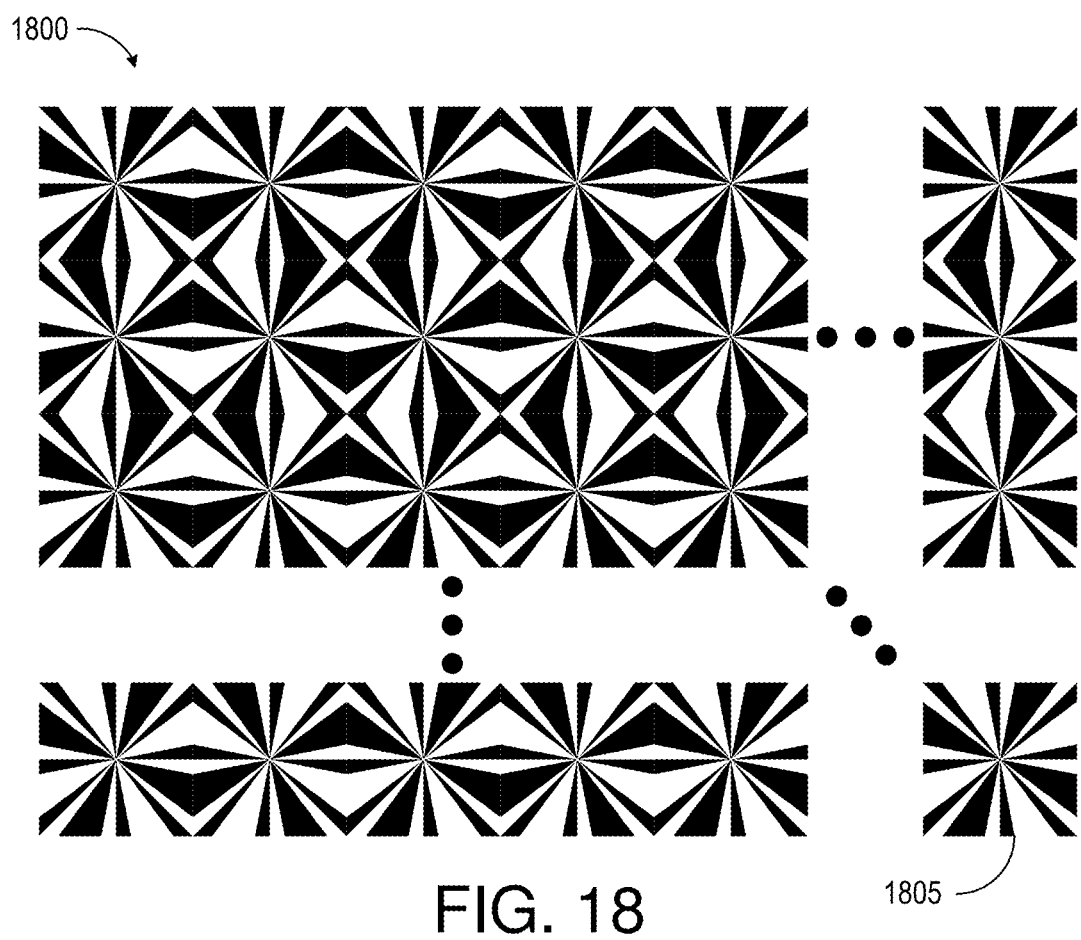
FIG. 18 depicts a two-dimensional array 1800 of gratings 1805 disposed over a photodiode array (not shown).

FIG. 18 depicts a two-dimensional array 1800 of gratings 1805 disposed over a photodiode array (not shown). Each of gratings 1805 is identical, but any number of parameters, many of which are discussed previously, can be varied within and among gratings 1805. For example, different shapes and types of gratings can be used to create and image different types of interference patterns that can be combined or used separately to obtain some desired result. The decision to consider all or a specific subset of information generated by one or more of the constituent gratings can be done once, such as at time of manufacture to accommodate process variations, or can be done dynamically to highlight different aspects of a scene. Emphasizing aspects of different patterns can be used, for example, to highlight light of different polarities, wavelengths, or angles of incidence.

Spaced gratings facing the same direction, particularly when their characteristics are well matched, can be used to sense moving objects. Assuming matched gratings with a fixed separation receiving light from the same scene, the difference between the photocurrents of the respective analyzer layers is sensitive only to objects relatively close to the pair. Further, the time derivative of this difference is sensitive to nearby, moving objects, and is insensitive to relatively distant moving or stationary objects.

Figure 19:
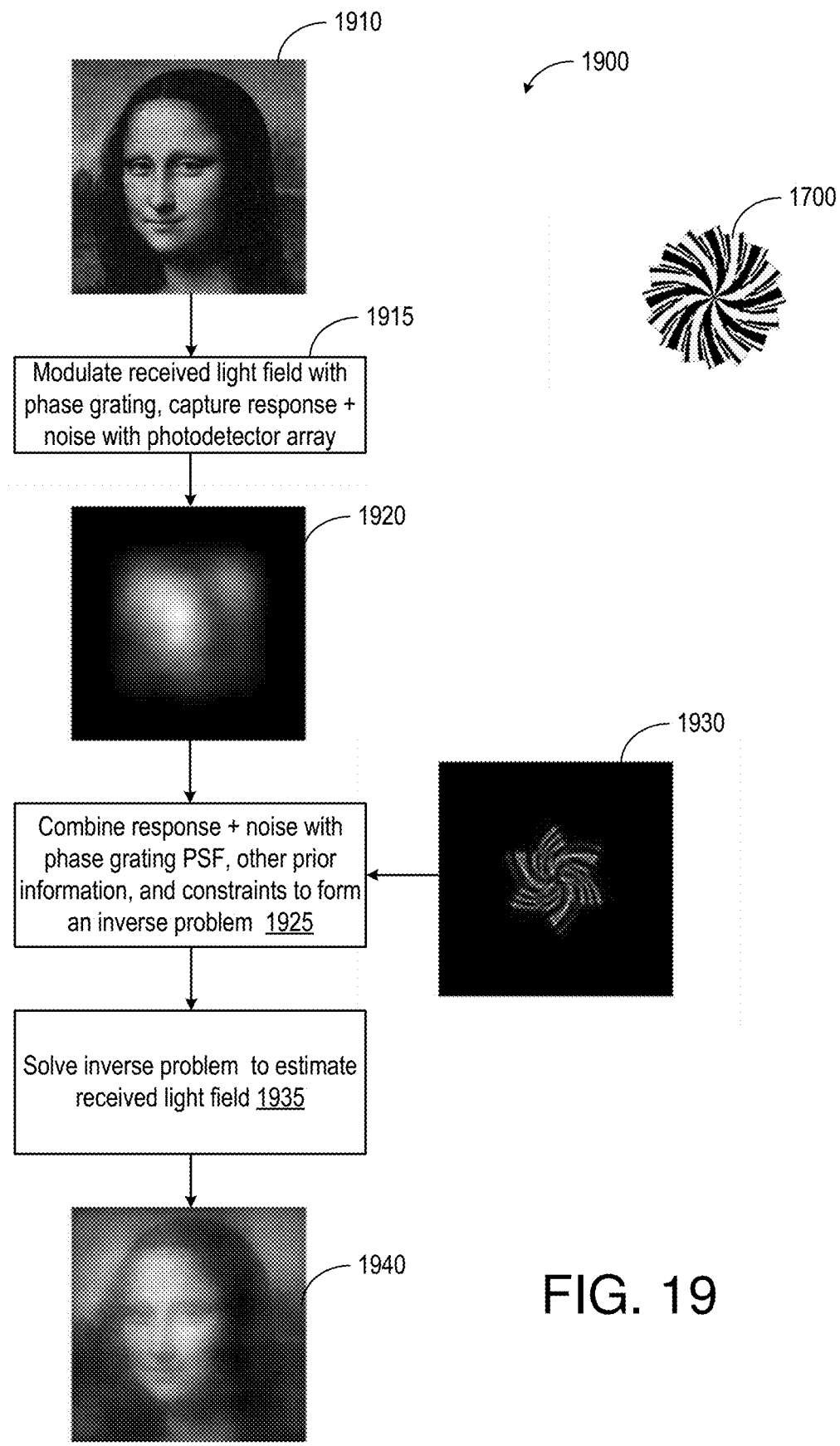
FIG. 19 is a flowchart 1900 detailing how an image 1905 is captured and resolved in accordance with grating 1700 of FIG. 17.

FIG. 19 is a flowchart 1900 detailing how an image 1905 is captured and resolved in accordance with grating 1700 of FIG. 17. First, an image 1910 is presented such that light from image 1910 is incident grating 1700. The incident light passes through phase grating 1700 to produce an intensity pattern 1920 on an underlying two-dimensional array of photosensors (not shown), which captures the pattern (1915). The captured pattern 1920 may appear unintelligible to a human; however, because grating 1700 has sharp features in its point-spread function (PSF), the pattern contains rich information about the image.

The PSF of grating 1700, possibly in combination with the underlying array, is known from a prior calibration or high-fidelity simulation. The way in which the PSF varies as a function of incident angle and color may also be similarly determined. This information is represented by a response 1930. A mathematical conversion based on this response can thus be used to reconstruct image 1910 from pattern 1920.

To recover the original image, responses 1920 and 1930 are combined to form an inverse problem (1925), which is solved (1935) to recover a version 1940 of the original image. One embodiment employs the well-known Tikhonov regularized inversion technique to accomplish steps 1925 and 1935. Take as a starting point a) detailed knowledge of the PSF of grating 1700, b) knowledge of the noise level of the system under current illumination conditions, and c) the specific readings observed for this image (pattern 1915). Express the unknown image as an N×1 vector x, where N is the total number of pixels one wishes to reconstruct. Express the readings from the photosensor as an M×1 vector y, where M is the total number of photosensors in the array. Express detailed knowledge of the PSF as an M×N matrix A such that for any image x, the formula expected observed signal y under x is y=Ax, called the "forward equation."

To reconstruct an image, it suffices to solve the forward equation with a known measurement vector y for an unknown image x as follows. Multiply both sides of the forward equation by the transpose of A ($A^T$) to obtain $A^T$ y=$A^T$ Ax. The matrix $A^T$ A is square and in principle could be directly inverted to recover x; however usually this inversion is poorly conditioned when noise is present and when not all eigenvectors of $A^T$ A have equally large associated eigenvalues. Thus in practice, Tikhonov regularization (as follows) usually delivers preferable results.

Next, select a regularization parameter $\lambda$>0 based on the noise level at the current illumination conditions. Finally, invert the matrix ($A^T$ A+$\lambda$I) (where I is the identity matrix), assume ($A^T$ A+$\lambda$I)≈($A^T$ A) and multiply on the left of the preceding equation to obtain x≈($A^T$ A+$\lambda$I)$^{-1}$ $A^T$ y. Therefore, for a given regularization parameter $\lambda$, the image recovered through Tikhonov regularization is a linear combination of the readings from the photosensor. If the PSF is sufficiently spatially invariant to the extent that its spatial dependence can be neglected, these computations can be done in the Fourier domain, allowing for much faster numerics.

Another embodiment recovers the matrix x using compressed sensing. If the scene is expected to be sparse in some basis (such as a wavelet transform W for natural images), the following methodology can be used. We can recover the sparse scene components z where x=Wz by finding the z that minimizes the following cost function: $\frac{1}{2}r^T r+\lambda f(z)$, where r is the residual (y−AWz), $\lambda$>0 is a regularization parameter (different from in (5), but also noise-dependent), and f(z) is a function penalizing non-sparse z. If f(z) is a convex function of z such as the $L_1$ norm, this optimization problem can be solved efficiently using convex optimization techniques. The penalty function f(z) can also take on other forms, including terms penalizing total variation in the reconstructed image x or other prior scene knowledge.

Some of the chief advantages of compressed sensing over linear approaches such as Tikhonov regularization are that the former allow more prior information about the expected scene structure to help shape the final image. Further, if $A^T$ A does not have full rank or cannot measure certain aspects of the scene (for example, due to some near-zero regions of the 2D Fourier transform of the PSF), using compressed sensing sometimes overcomes these limitations given correct prior information about the expected images.

The foregoing Tikhonov and compressed-sensing techniques can include iterative methods to reduce problem complexity. For example, Richardson-Lucy deconvolution can iteratively approximate Tikhonov regularized inversion and iterated wavelet thresholding can be a numerically efficient way to converge to a compressed-sensing-like solution.

In some embodiments the purpose of the sensor is not to reconstruct an image, but to perform some optical sensing task. In such cases the vector x may represent the sought measurement rather than the field of image pixels, and the forward transform A can be appropriately modified.

Figure 20:
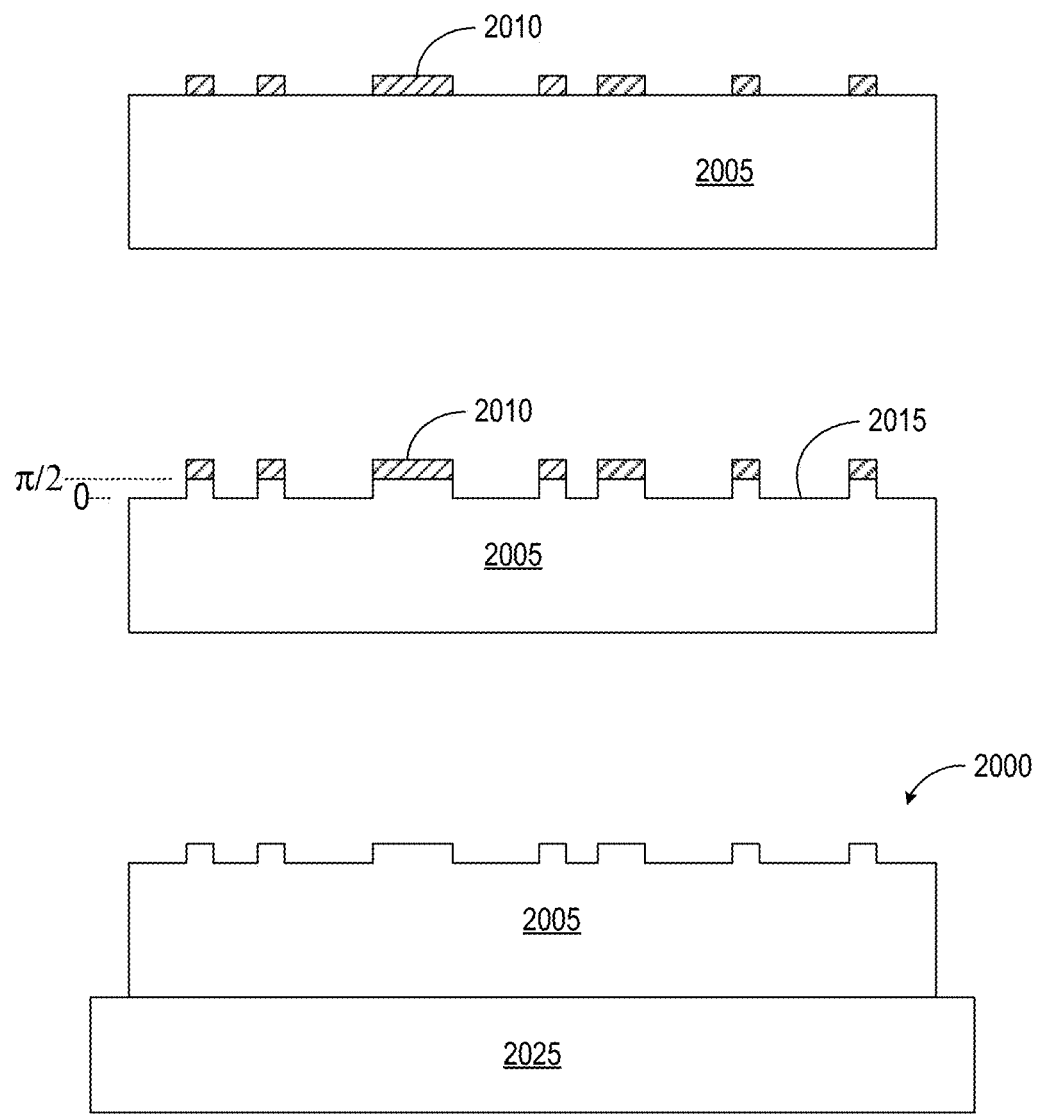
FIG. 20 depicts lithographic process for forming an image sensor 2000 in accordance with one embodiment.

FIG. 20 depicts lithographic process for forming an image sensor 2000 in accordance with one embodiment. First, a wafer 2005 of material that is transparent over the wavelength band of interest is patterned with a mask 2010 that defines the relatively high features of what will become an odd-symmetry grating surface of the type detailed herein. Next, the exposed surface of wafer 2005 is etched to create recessed regions 2015. Mask 2010 is then removed. Finally, wafer 2005, now comprising a grating, is bonded to a photodiode array 2025. Photolithographic and wafer-bonding processes are well known to those of skill in the art, so a detailed discussion is omitted.

While the present invention has been described in connection with specific embodiments, other embodiments are also envisioned. For example, while each grating detailed previously may be used in connection with photoreceptors to collect incident light, gratings in accordance with these and other embodiments can be used more generally in imaging devices that project images from photo-emitters rather than or in addition to sensing them. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A transmissive phase grating comprising:
    a plurality of boundaries extending radially over an area, each boundary defined by adjacent and transparent first and second features symmetrically disposed on either side of that boundary;
    a first filter covering a first portion of the area; and
    a second filter covering a second portion of the area.

2. The transmissive phase grating of claim 1, wherein the first filter comprises a first polarization filter of a first orientation and the second filter comprises a second polarization filter of a second orientation different from the first orientation.

3. The transmissive phase grating of claim 2, wherein the first orientation is perpendicular to the second orientation.

4. The transmissive phase grating of claim 1, wherein the area is round.

5. The transmissive phase grating of claim 1, wherein the boundaries are curved.

6. The transmissive phase grating of claim 1, wherein the boundaries are discontinuous.

7. The transmissive phase grating of claim 1, each boundary to induce, at a position underlying that boundary, for light in a wavelength band of interest incident the transmissive phase grating and normal to a transverse plane of the grating, a half-wavelength shift of the light through the transparent first feature with respect to the light passing through the adjacent transparent second feature.

8. The transmissive phase grating of claim 7, wherein the boundaries are discontinuous.

9. The transmissive phase grating of claim 1, wherein the first filter surrounds the second filter.

10. The transmissive phase grating of claim 9, wherein the first filter and the second filter are concentric.

11. The transmissive phase grating of claim 9, further comprising a third filter covering a third portion of the area.

12. The transmissive phase grating of claim 11, wherein the third filter surrounds the first filter and the second filter.

13. The transmissive phase grating of claim 12, wherein the first filter is a blue filter, the second filter is a green filter surrounding the first filter, and the third filter is a red filter surrounding the green filter.

14. The transmissive phase grating of claim 1, wherein the area is of a plane.

15. An imaging device comprising:
a photodiode array;
a transmissive phase grating with diverging boundaries extending over an area of the photodiode array, each boundary defined by immediately adjacent and transparent first and second features symmetrically disposed on either side of that boundary;
a first filter covering a first portion of the area; and
a second filter covering a second portion of the area.

16. The imaging device of claim 15, wherein the first filter comprises a first polarization filter of a first orientation and the second filter comprises a second polarization filter of a second orientation different from the first orientation.

17. The imaging device of claim 16, wherein the first orientation is perpendicular to the second orientation.

18. The imaging device of claim 15, wherein the first filter surrounds the second filter.

19. The transmissive phase grating of claim 18, wherein the first filter and the second filter are concentric.

\* \* \* \* \*